United States Patent [19]

Turner et al.

[11] 4,177,423
[45] Dec. 4, 1979

[54] BRIDGE CIRCUITS

[75] Inventors: Roy C. Turner, Slough; Philip J. Constable, Uxbridge, both of England

[73] Assignee: Drayton Controls (Engineering) Limited, West Drayton, England

[21] Appl. No.: 813,254

[22] Filed: Jul. 6, 1977

[30] Foreign Application Priority Data

Jul. 7, 1976 [GB] United Kingdom ............... 28322/76

[51] Int. Cl.² ...................... G01R 17/06; G01R 17/00; G01R 27/02; G01K 7/14
[52] U.S. Cl. .................................... 324/99 R; 73/360; 324/62; 324/98
[58] Field of Search ................ 324/99 R, 98, 100, 62; 73/360, 362 AR

[56] References Cited

U.S. PATENT DOCUMENTS

| 1,209,372 | 12/1916 | Wunsch | 73/360 |
| 2,031,050 | 2/1936 | Leeds | 73/360 |
| 2,951,211 | 8/1960 | Brashear | 324/99 R |

Primary Examiner—Rudolph V. Rolinec
Assistant Examiner—Ernest F. Karlsen
Attorney, Agent, or Firm—Kane, Dalsimer, Kane, Sullivan and Kurucz

[57] ABSTRACT

A bridge circuit for measuring or use in a temperature-responsive servo-mechanism. A chain of four or alternatively five resistors is connected between power supply rails, an inner two resistors of the chain being shunted by the track of a potentiometer. A balancing potentiometer is connected directly across the supply rails and has its wiper connected to one side of a balance detector through a high value resistor. The signal to be measured is applied between the chain of resistors and the other side of the balance detector. There is a resistive connection from the wiper of the first-mentioned potentiometer and the resistor chain to the end of the high value resistor nearer the detector. The signal to be measured is derived from a resistance-type or thermo-couple temperature sensor. Reference junction compensation for the latter is described.

12 Claims, 3 Drawing Figures

BRIDGE CIRCUITS

This invention relates to bridge circuits.

A known bridge circuit comprises first and second resistors connected in series between two bridge supply rails, a third resistor connected at one of its ends to one of the supply rails and at its other end to one end of the track of a balancing potentiometer, an adjustable calibrating resistor in parallel with the balancing potentiometer, a zero-setting potentiometer with its track connected from the other end of the track of the balancing potentiometer to one end of a fourth resistor the other end of which is connected to the other supply rail, a fifth resistor having one end connected to the slider of the balancing potentiometer, and a sixth resistor connected from the other end of the fifth resistor to the slider of the zero-setting potentiometer. In use, an unknown voltage and a balance detector are connected from the junction of the first and second resistors to the junction of the fifth and sixth resistors and the bridge brought to balance using the balancing potentiometer.

Such a bridge circuit suffers from a number of disadvantages. First, the zero-setting potentiometer and calibration resistor are not independent of each other which adds to the difficulty of initial adjustment of the bridge. Second and more important, where voltages of, say, tens of millivolts are to be measured, special precautions have to be taken to avoid temperature effects from affecting the reading of the bridge. Resistors of high quality and low temperature coefficient need to be used. Furthermore, to achieve a particular calibration resistance values different from the "preferred values" of resistance often need to be used which adds to the expense of constructing the bridge. The fact that the balancing potentiometer is used directly to change the balance of the bridge means that where small voltages (tens of millivolts, say) are being measured the bridge circuit is susceptible to the effects of dirt, contact potential and thermo-electric effects between the slider and track of the balancing potentiometer.

It is an object of the invention to provide an improved bridge circuit.

The present invention provides a bridge circuit comprising first and second resistance means in series between two bridge supply terminals, third and fourth resistance means including the track of a balancing potentiometer and connected in parallel with the series-connected first and second resistance means, fifth resistance means connected from the slider of the potentiometer through sixth resistance to the junction of the first and second resistance means, the resistance of the fifth resistance means being high compared with the resistance of the first, second and sixth resistance means, and terminals for connecting a voltage to be measured and a balance detector in series between the junction of the first and second resistance means and the junction of the fifth and sixth resistance means.

The track of the bridge-balancing potentiometer can constitute the whole of the third and fourth resistance means.

The first and/or second resistance means can include the track of a zero setting potentiometer to the slider of which the sixth resistance means is connected.

The sixth resistance means can include an adjustable resistor.

The fifth resistance means can include an adjustable resistor.

A differential amplifier can be connected in series between the terminals as a balance detector.

The differential amplifier can be connected to control a servo-motor mechanically coupled to the slider of the balancing potentiometer.

A filter circuit can be connected before the differential amplifier.

A network comprising seventh, eight, ninth, tenth and eleventh resistance means can be connected between the terminals for the voltage to be measured, the seventh resistance means being connected in series with the eighth resistance means between the two terminals, the junction of the seventh resistance means and the eighth resistance means being connected through the ninth resistance means to one supply terminal, the tenth and eleventh resistance means being each connected from the other supply terminal to a respective end of the series combination of the seventh resistance means and the eighth resistance means, and the values of the ninth, tenth and eleventh resistance means being large compared with the values of the first, second, seventh and eighth resistance means.

The tenth and eleventh resistance means can each have a value substantially twice the value of the ninth resistance means and the seventh and eighth resistance means can be approximately equal in value.

The network can be in series with a thermo-couple between the terminals for the voltage to be measured and can be arranged to provide temperature compensation for the reference junction of the thermo-couple.

The network can be arranged to provide the voltage to be measured and the seventh resistance means can be a resistance-type transducer.

By way of example only, two illustrative embodiments of the invention will now be described with reference to the accompanying drawings, in which.

Figure 1:
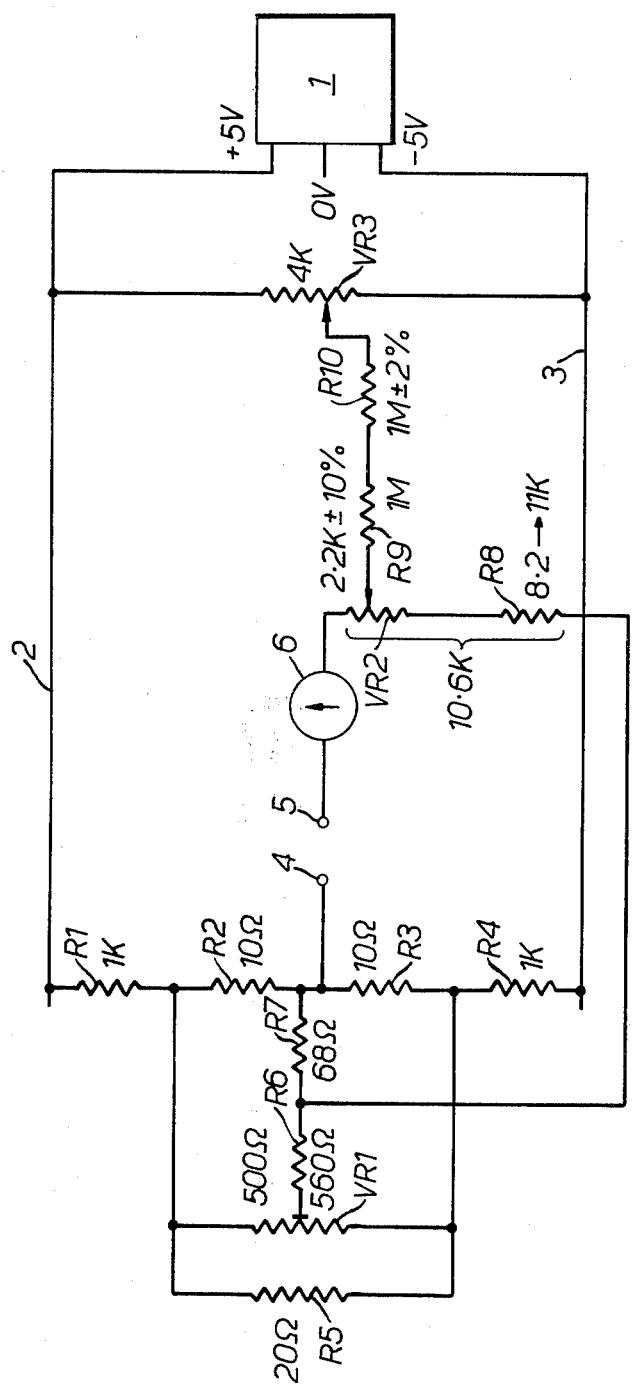
FIG. 1 shows a measuring bridge circuit.

FIG. 1 shows a circuit for measuring a d.c. potential in the range +25 to −25 mV. A balanced power supply 1 supplies +5 V to a first supply rail 2 and −5 V to a second supply rail 3. A 1 kilohm resistor R1 has one end connected to the rail 2 and its other end connected to one end of a 10 ohm resistor R2. The other end of the 10 ohm resistor R2 is connected to one end of another 10 ohm resistor R3, the other end of which is connected to one end of another 1 kilohm resistor R4. The other end of the resistor R4 is connected to the rail 3. A 20 ohm resistor R5 is connected from the junction of resistors R1 and R2 to the junction of resistors R3 and R4. A 500 ohm low temperature coefficient, for example, cermet pre-set potentiometer VR1 is connected in parallel with resistor R5 and has its slider connected to one end of a 560 ohm resistor R6. A 68 ohm resistor R7 is connected from the other end of resistor R6 to the junction of resistors R2 and R3.

A terminal 4 is connected to the junction of resistors R2 and R3 and another terminal 5 is connected to one side of a balance detector 6. The other side of the balance detector 6 is connected to one end of a 2.2 kilohm ±10% potentiometer VR2, the other end of which is connected through a resistor R8 to the junction of resistors R6 and R7. The resistor R8 has a preferred value in the range 8.2 to 11 kilohm so that with potentiometer VR2 the total value is 10.6 kilohm approximately.

The slider of potentiometer VR2 is connected through two series-connected 1 Megohm resistors R9 and R10 (R9 can alternatively be an adjustable resistor and VR2 omitted) to the slider of a 4 kilohm wirewound measuring potentiometer VR3. Potentiometer VR3 is connected directly between the rails 2 and 3 and has a measuring scale (not shown) associated with its slider.

All the resistors employed are of the type known as "thick-film" resistors and the track of potentiometer VR3 is wound on an enamelled copper wire.

The source of d.c. potential to be measured (for example, the output of a measuring transducer) is connected between the terminals 4 and 5. An initial adjustment is made to the circuit using potentiometers VR1 and VR2. Terminals 4 and 5 are short-circuited and measuring potentiometer VR3 set to the centre of its scale, and the potentiometer VR1 adjusted to obtain a null indication on the detector 6. These steps set the zero reading. Next potentiometer VR3 is set to one end of its scale and 25 mv input applied to the terminals 4 and 5, and potentiometer VR2 adjusted to give a null once more. The settings of potentiometers VR1 and VR2 are largely independent but their adjustment can be repeated as a precautionary measure. The potentiometer VR3 is now calibrated to read from +25 to −25 mV by connecting the unknown voltage to terminals 4 and 5 and adjusting potentiometer VR3 to obtain a null reading.

The bridge circuit is comparatively insensitive to ambient temperature effects on its component resistors. This is believed to result from the fact that the reference potential at the right hand side of balance detector 6 is largely derived from the same source (resistors R1, R2, R3, R4) as the potential at the left hand side of balance detector 6 so that temperature effects cancel at or in the said detector. Further, because potentiometer VR3 is connected directly across the supply rails its output is not changed by its temperature because all the resistance between the rails will be uniformly affected by temperature (the copper core of the track helps to ensure uniformity of heating). The voltage across the track of potentiometer VR3 is ten volts and the resistors R9 and R10 and potentiometer VR2 have an attenuating effect on the output of potentiometer VR3 to give the small variation in voltage at the right hand side of detector 6 necessary to bring the bridge to balance. By this means, the circuit is made comparatively insensitive to the effects of dirt, contact potential and thermo-electric potential between the slider and track of potentiometer VR3. It will be noted that even though an exact calibration of +25 to −25 mV has been specified, the resistance values used are all preferred values.

The value of resistor R10 in series with the slider of potentiometer VR3 is high in comparison with the resistance from the slider of potentiometer VR2 to the junction of resistors R2 and R3 (approximately 10 kilohm) and is high in comparison with the values of R1, R2, R3 and R4. It is this arrangement of comparative resistance values which enables the desirable ambient temperature stability characteristics to be achieved. The advantageous result that the output characteristic of VR3 is substantially linear is also achieved.

Figure 2:
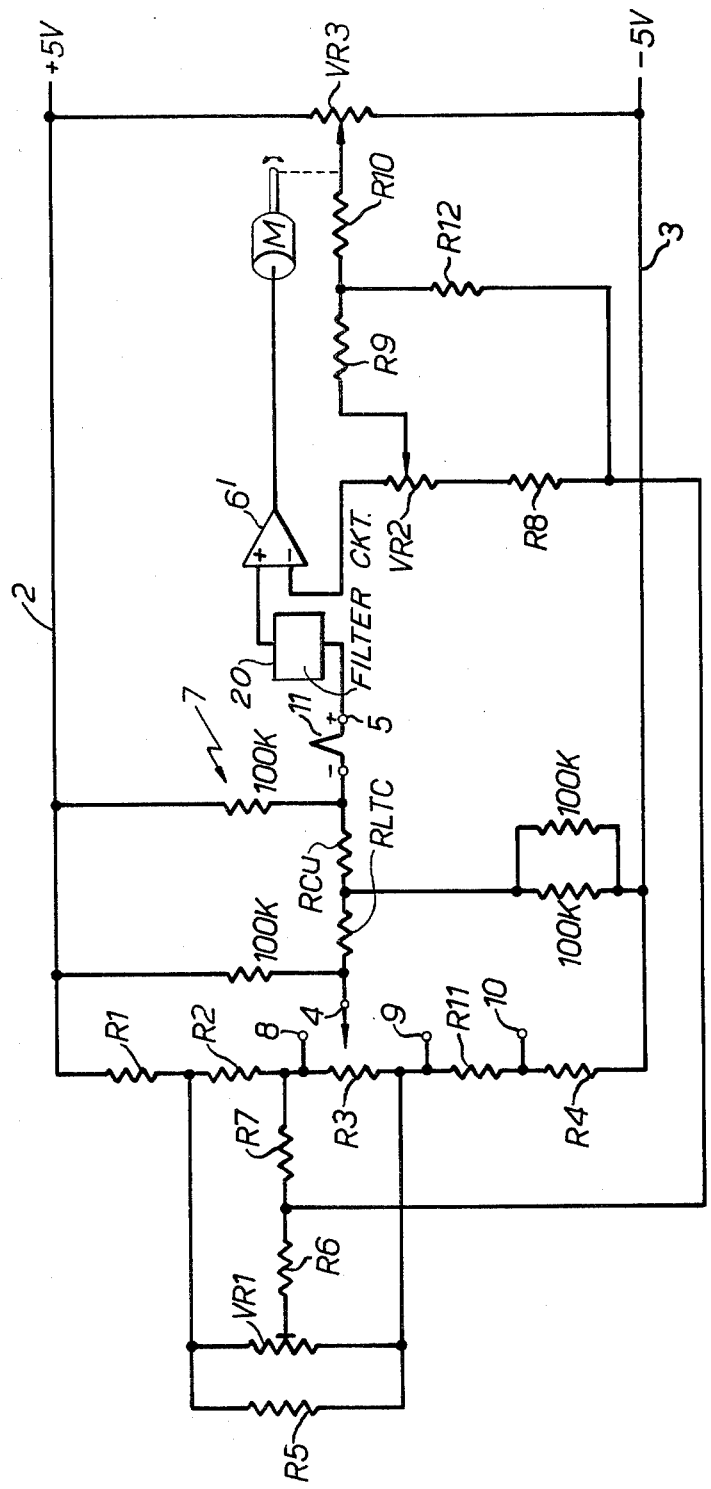
FIG. 2 shows a thermo-couple actuated servo-mechanism.

FIG. 2 shows the circuit of a servo-mechanism employing a modified form of the circuit of FIG. 1 in which a mechanical output representing temperature is produced. Those parts of the circuit of FIG. 2 which are identical with parts of FIG. 1 have been given identical reference numerals and the present description will be confined to the differences between FIGS. 1 and 2.

In FIG. 2, the terminal 4 is connected to any one of three terminals 8, 9 and 10. A resistor R11 is connected in series with and between resistors R3 and R4. Terminal 8, 9 and 10 are connected respectively to the junctions of resistors R2 and R3, resistors R3 and R11, and resistors R11 and R4.

The null detector 6 is replaced by a differential amplifier 6' connected to drive a motor M, the shaft of which is coupled to the slider of potentiometer VR3. The motor M and potentiometer VR3 can be used in conjunction with a linkage as described in our co-pending application No. 28327/76. The measuring scale of potentiometer VR3 is not necessarily required for the circuit of FIG. 2.

A resistor R12 is connected from the junction of resistors R9 and R10 to the end of R8 remote from potentiometer VR2.

A thermo-couple 11 and compensating circuit 7 are connected between the terminals 4 and 5. It is assumed that the temperature range of interest causes the thermo-couple to give an output in the range +25 to −25 to mV (centre-zero working).

When terminal 4 is connected to terminal 8, the circuit of FIG. 2 operates similarly to the circuit of FIG. 1 except that the null position of the slider of potentiometer VR3 is achieved automatically instead of manually.

Terminal 4 is connected to terminal 9 when the thermocouple output to be measured lies in the range 0 to +50 mV (end of scale zero working). Terminal 4 is connected to terminal 10 when the thermocouple output to be measured lies in a range in which zero volts does not appear (suppressed zero working).

For a "span" of 50 mV (25–0–25, 0–50 mV) the resistors have the values given in FIG. 1, R11=zero, and R12= ∞. Other calibrations are given in the table:

| Range | R1, R2 | R3, R4 | R9 | R12 |
|---|---|---|---|---|
| 50–0–50 or 0–100 mV | 1K | 10Ω | 0 | ∞ |
| 10–0–10 or 0–20 mV | 2.5K | 5Ω | * | * |
| 5–0–5 or 0–10 mV | 2.5K | 5Ω | * | * |
| 2.5–0–2.5 or 0–5 mV | 5K | 5Ω | 500K | 25K |
| 1.25–0–1.25 or | 10K | 5Ω | 1M | 25K |

* = select on test
For all the above table R11 = zero.

To give a suppressed zero scale of 2.5 to 5 mV with a connection to terminal 10, the resistance of R11=5 ohms, R5=10 ohms, R2=R3=5 ohms, R1=R4=10 kilohm, R9=1 Megohm, and R12=25 kilohm.

The compensating circuit 7 compensates for the reference junction of the thermo-couple being at an ambient rather than at a reference temperature. The circuit comprises a copper resistor RCu and a low temperature coefficient resistor RLTC connected in series with the thermo-couple 11. A respective high value (typically 100 kilohms) resistor is connected from each end of the series combination of resistors RCu and RLTC to the supply rail 2. Two 100 kilohm resistors in parallel (to give 50 kilohm which is not a preferred value and to balance the temperature characteristic of the other two 100 kilohm resistors) are connected from the junction of resistors RCu and RLTC to the supply rail 3. Suitable values for the resistors RCu and RLTC are about 200 to 300 ohms each for thermo-couples of chromel/Alumel (registered TRADEMARK), copper/constantin or iron/constantin. A thermo-couple of platinum/13% rhodium and platinium alloy requires values of about 30 ohms.

Where the thermo-couple 11 has long leads connecting it to the circuit a filter circuit 20 can be connected between the thermo-couple and the amplifier 6' to reduce interference from adjacent circuits. A "twin T" filter can be used.

Extra resistors connected to the R1, R2, R3, R4 resistor chain can be included to give a signal input as a fail-safe precaution in case the thermo-couple should fail. For example, terminal 5 can be connected through a 330 kilohm resistor onto a resistor junction in the resistor chain R1, R2, R3, R11, R4 (the chain can, if desired, include additional resistors for this purpose) to give the fail-safe input signal (at terminal 5). The resistor junction to which the 330 kilohm resistor is connected is chosen to give an "up-scale", "within-scale" or "down-scale" reading as desired in the event of failure of the thermo-couple 11.

The bridge circuit can be used with an a.c. input to be measured if the supply rails are connected to an a.c. source of corresponding frequency and phase.

Resistor R10 can have a value chosen to load the output of potentiometer VR3 so as to give it a desired output characteristic.

Figure 3:
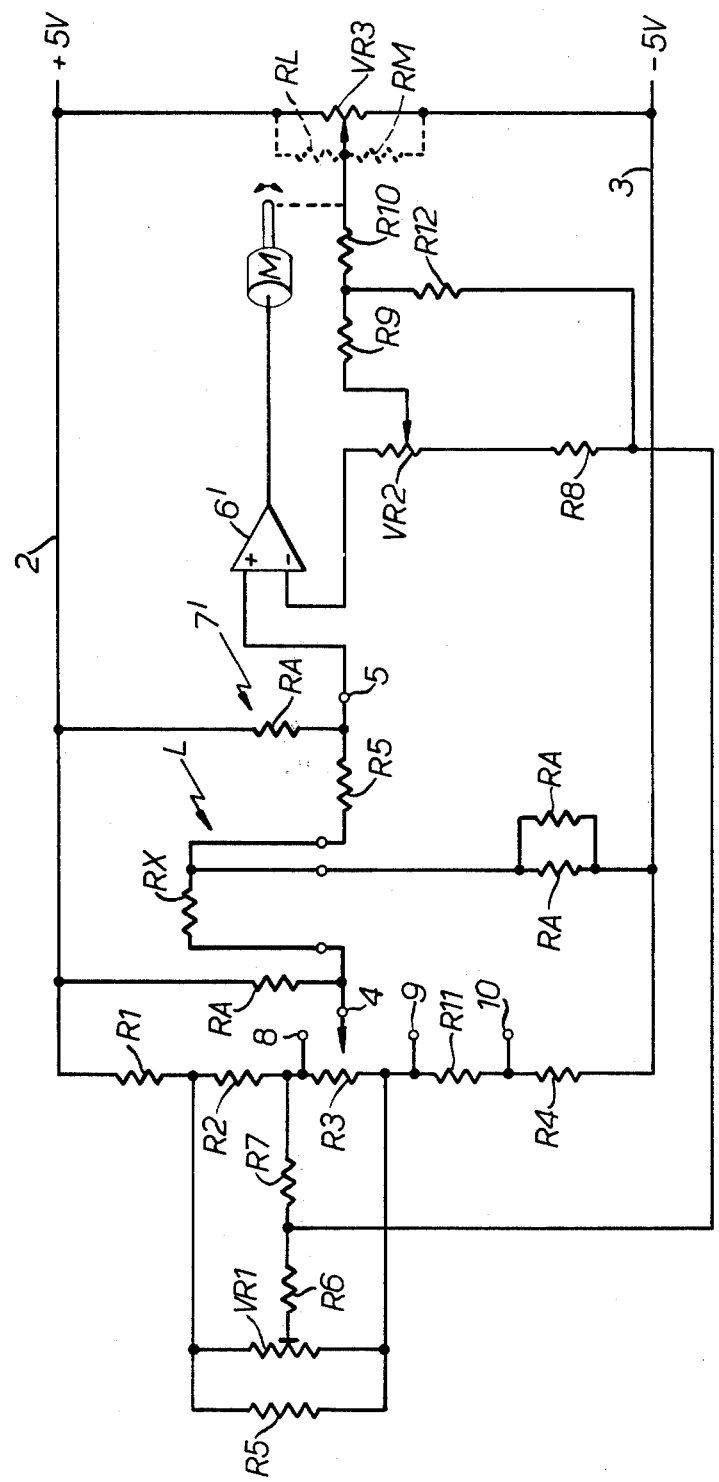
FIG. 3 shows a resistance transducer actuated servo-mechanism.

FIG. 3 shows a servo-mechanism circuit which is basically the same as the circuit of FIG. 2 except that the thermo-couple 11 is omitted and a resistance transducer RX is used as a sensor. The similarities between FIGS. 2 and 3 is indicated by the use of identical reference numerals for corresponding parts. The resistance transducer RX is connected in a transducer network 7' of identical circuit configuration to the compensating circuit 7 of FIG. 2. The transducer RX is in series with a reference resistor RS, the junction of RX and RS being connected through two parallel-connected resistors of value RA to supply rail 3. The ends of RX and RS remote from their interconnection are each connected to the supply rail 2 through a respective resistor of value RA. The value of RS is equal to the middle of range value of RX and the value RA is large in comparison with the values of RX and R5 and is chosen to give a desired span and level of output. The value RA is substantially greater than the values of R1, R2, R3, R11 and R4. For temperature sensing the transducer RX can, for example, be a platinum sensor resistor of a nominal 200 ohms resistance connected in circuit by a three-wire lead L as is illustrated. The use of a three-wire lead allows a reasonable length (or more strictly resistance) of lead to a remote sensing point without any appreciable affect on accuracy. In an alternative application, the transducer RX could be a strain gauge.

The transducer network 7' is advantageous in providing a voltage signal between the terminals 4 and 5 which has a substantially linear relationship to change in value of the resistance transducer RX.

It was stated in regard to FIG. 2 that resistor R10 can be chosen to give a desired output characteristic of potentiometer VR3. An alternative way of changing the output characteristic is shown in broken outline in FIG. 3. In FIG. 3, two resistors RL and RM are connected in series across the potentiometer VR3 and have their junction connected to the slider of potentiometer VR3.

What is claimed is:
1. A measuring bridge circuit comprising first and second standard resistance means in series between two bridge supply terminals, third and fourth series-connected resistance means including the track of a balancing potentiometer having a slider and connected in parallel with the series-connected first and second resistance means, fifth resistance means connected from the slider of the potentiometer by way of sixth resistance means to the junction of the first and second resistance means, the resistance of the fifth resistance means being high compared with the resistance of the sixth resistance means, a balance detector and means for connecting a voltage to be measured and the balance detector in series between the junction of the first and second resistance means and the junction of the fifth and sixth resistance means.

2. A circuit as claimed in claim 1, wherein the track of the bridge-balancing potentiometer constitutes the whole of the third and fourth resistance means.

3. A circuit as claimed in claim 1, wherein the first, the second, or the first and second resistance means includes the track of a zero setting potentiometer to the slider of which the sixth resistance means is connected.

4. A circuit as claimed in claim 1, wherein the sixth resistance means includes an adjustable resistor.

5. A circuit as claimed in claim 1, wherein the fifth resistance means includes an adjustable resistor.

6. A circuit as claimed in claim 1, wherein the balance detector includes a differential amplifier.

7. A circuit as claimed in claim 6, wherein the differential amplifier is connected to control a servo-motor mechanically coupled to the slider of the balancing potentiometer.

8. A circuit as claimed in claim 6, wherein a filter circuit is connected to the input of the differential amplifier.

9. A bridge circuit comprising first and second resistance means in series between two bridge supply terminals, third and fourth series-connected resistance means including the track of a balancing potentiometer having a slider and connected in parallel with the series-connected first and second resistance means, fifth resistance means connected from the slider of the potentiometer by way of sixth resistance to the junction of the first and second resistance means, the resistance of the fifth resistance means being high compared with the resistance of the sixth resistance means, terminals for connecting a voltage to be measured and a balance detector in series between the junction of the first and second resistance means and the junction of the fifth and sixth resistance means, and a network comprising seventh, eighth, ninth, tenth and eleventh resistance means connected between the terminals for the voltage to be measured, the seventh resistance means being connected in series with the eighth resistance means between the two terminals, the junction of the seventh resistance means and the eighth resistance means being connected by way of the ninth resistance means to one supply terminal, the tenth and eleventh resistance means being each connected from the other supply terminal to a respective end of the series combination of the seventh resistance means and the eighth resistance means, and the values of the ninth, tenth and eleventh resistance means being large compared with the values of the first, second, seventh and eighth resistance means.

10. A circuit as claimed in claim 9, wherein the tenth and eleventh resistance means have each a value substantially twice the value of the ninth resistance means and the seventh and eighth resistance means are approximately equal in value.

11. A circuit as claimed in claim 9, wherein a thermocouple supplies the voltage to be measured and the seventh resistance means is temperature sensitive to provide temperature compensation for the reference junction of the thermo-couple.

12. A circuit as claimed in claim 9, wherein the network includes means to provide the voltage to be measured and the seventh resistance means is a resistance-type transducer.

* * * * *